(12) United States Patent
Foley

(10) Patent No.: US 11,515,865 B1
(45) Date of Patent: Nov. 29, 2022

(54) SERIALIZER CLOCK DELAY OPTIMIZATION

(71) Applicant: MACOM Technology Solutions Holdings, Inc., Lowell, MA (US)

(72) Inventor: David Foley, Sophia Antipolis (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/552,297

(22) Filed: Dec. 15, 2021

(51) Int. Cl.
| | |
|---|---|
| *H03K 19/00* | (2006.01) |
| *H03K 5/135* | (2006.01) |
| *H03K 5/14* | (2014.01) |
| *H04L 1/20* | (2006.01) |
| *H03K 19/17728* | (2020.01) |
| *H03K 19/173* | (2006.01) |
| *H03K 5/15* | (2006.01) |

(52) U.S. Cl.
CPC .............. *H03K 5/135* (2013.01); *H03K 5/14* (2013.01); *H03K 19/1737* (2013.01); *H03K 19/17728* (2013.01); *H04L 1/203* (2013.01); *H03K 5/15* (2013.01)

(58) Field of Classification Search
None
See application file for complete search history.

(56) References Cited

U.S. PATENT DOCUMENTS

| | | | | |
|---|---|---|---|---|
| 2009/0284401 | A1* | 11/2009 | Nanevicz | H03M 9/00 341/141 |
| 2019/0363704 | A1* | 11/2019 | Miura | H03K 5/135 |
| 2021/0091861 | A1* | 3/2021 | Nodenot | H04L 1/0071 |

\* cited by examiner

*Primary Examiner* — Tuan T Lam
(74) *Attorney, Agent, or Firm* — Weide & Miller, Ltd.

(57) ABSTRACT

A serializer clock delay optimization system comprising a multiplexer configured to receive two or more low-rate data signals and a multiplexer control signal. The multiplexer generates a full-rate data signal by combining the two or more low-rate data signals such that the multiplexer control signal determines sampling time of the low-rate data signals. A data monitor monitors and evaluates the full-rate data signal to generate a quality value representing the quality of the full-rate data signal. The quality of the full-rate data signal is based on the accuracy of the sampling time of the low-rate data signals. A delay controller processes the quality value to generate a delay control signal or value. A delay receives a clock signal and the delay control signal or value. Responsive to the delay control signal or value, the delay modifies the timing of the clock signal to create the multiplexer control signal.

20 Claims, 7 Drawing Sheets

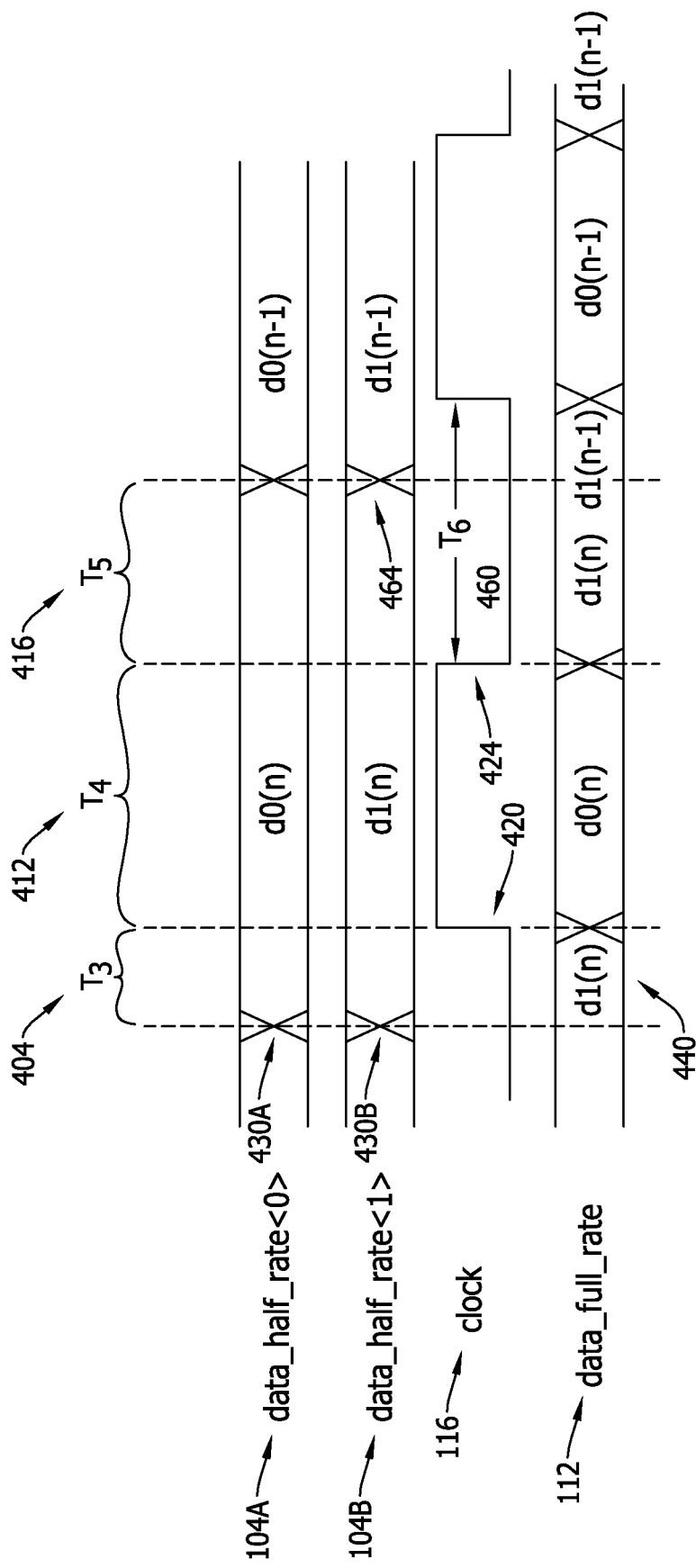

SERIALIZER CLOCK DELAY OPTIMIZATION

FIELD OF THE INVENTION

The innovation relates to serializes and de-serializers and in particular to a method and apparatus for controlling timing.

RELATED ART

FIG. 1 illustrates a block diagram of an example embodiment of a multi-station communication system as an example environment of use. As shown, a first station 120 is configured to communicate over one or more channels 154 with a second station 128. Each of the first station 120 and the second station 128 may comprise a receiver 172A, 172B and a transmitter 166A, 166B. At least one of the receivers 172A, 427B and transmitters 166A, 166B connect to processing devices 150A, 150B, 150C, 150D as shown. The processing devices 150 may comprise one or more processor, ASIC, control logic, switch fabric, modulator, de-modulator, inverters, multiplexers, buffers, or any other device. Input to the processing devices 150 may occur in any manner known in the art. Similarly, although certain paths or interfaces are shown as either serial or parallel, it is fully contemplated that any of these paths may be configured as either serial, parallel paths, or both.

FIG. 2 illustrates a multiplexer configured in two to one serializer configuration. This is but one possible example embodiment and it is contemplated that other embodiments or configurations are possible. This embodiment is a two to one serializer, but the multiplexer may be configured as a N to M serializer where N and M are any whole numbers and N is greater than M. For example, the serializer maybe a four to one serializer such as would be used in the system of FIG. 1.

As shown in FIG. 2, a multiplexer 108 is configured to receive two lower rate data streams, such as half-rate stream 104A and half-rate stream 104B. In other embodiments, a greater number of low-rate data streams may be provided to the multiplexer 108. The multiplexer 108 also receives a clock input 116, or control signal which selects which of the two inputs 104A, 104B are provided as a full-rate output 112. The full-rate output 112 comprises both of the two half-rate signals 104A, 104B, but at double the data rate. The half-rate signals 104A, 104B are more suitable for processing than the full-rate data signal 112.

FIG. 3 illustrates plots of the inputs to the multiplexer shown in FIG. 2 and the resulting output signal. These plots are shown for the purpose of discussion and should not be considered as being to scale. As shown, the two half-rate inputs 104A, 104B which may be a high level 304 or a low level 308, and it transitions between high and low levels based on the content of the data. Half-rate signal 104A is referred to as D(0), and the half rate signal 104B is referred to as D(1). The clock signal is at a frequency that is double the half-rate data signals 104A, 104B and it controls when the multiplexer is outputting the D(0) signal 104A or the D(1) signal 104B. The bottom signal plot represents the full-rate signal 112 formed from the two half rate signals D(0) 104A and D(1) 104B.

In the embodiment shown in FIG. 2, when the clock signal 116 is high, the multiplexer is sampling or outputting half-rate signal D(0) 104A, while when the clock signal is low, half-rate signal D(1) 104B is output from the multiplexer. Thus, during time T1 320, the multiplexer is outputting signal D(0) 104A because the clock is high and during time T2 324 the multiplexer is outputting signal D(1) 104B because the clock is low.

Through the rising edge of the clock signal at the beginning of time T1 320, the clock signal goes high, and this coincides with the data transition of the half-rate signals D(0) 104A, D(1) 104B. Accurate alignment of the clock transition with the data transition from high to low, or low to high values ensures that the multiplexer output will likewise accurately reflect the value of the signal during each clock cycle. For example, in the high-rate signal 112 the data 340 output from the multiplexer is taken from the data signal D(0) 104A during the duration of the time when the clock signal is high T1 320. As the clock transitions to a low level, the multiplexer outputs the data signal D(1) 104B as the multiplexer output 344. Then when the clock signal transitions to a high level, the multiplexer again outputs the D(0) 104A signal. It should be noted that the signals D(0) 104A, D(0)104B, and the resulting full-rate signal 112 varies based on the data, and the multiplexer clock signal controls which signal is being sample, namely D(0) or D(1).

SUMMARY

To overcome the drawbacks of the prior art and provide additional benefits, a serializer clock delay optimization system is disclosed. In one embodiment, the system comprises a multiplexer configured to receive two or more low-rate data signals and a multiplexer control signal to generate a full-rate data signal by combining the two or more low-rate data signals. A data monitor is configured to monitor and evaluate the full-rate data signal to generate a quality value representing the quality of the full-rate data signal. A delay controller is configured to process the quality value and responsive thereto generate a delay control signal or value. One or more delays are configured to receive a clock signal and the delay control signal or value and, responsive to the delay control signal or value, modify the timing of the clock signal to create the multiplexer control signal.

The data monitor may comprise an eye diagram monitor and the quality signal represents one or more characteristics of the eye formed by the full-rate data signal. In addition or instead, the data monitor may comprise a bit error rate generator, and the quality value comprises a bit error rate of the full-rate data signal. It is contemplated that the two or more low-rate data signals comprise two signals which are at a data rate which is one-half of the full-rate data signal. The delay controller may comprise control logic configured to process the quality value. In one exemplary configuration, the system further comprises memory accessible by the delay controller, such that the memory is configured to store delay control values in a look-up table.

Also disclosed is a method for optimizing sample-timing of a serializer. In one embodiment, this method comprises receiving two or more lower rate data signals at a serializer and converting the two or more lower rate data signals to create a higher rate data signal. The timing of the serializer's converting is controlled by a serializer control signal. The serializer control signal may be a signal or a value, such as if pulled from memory (look up table or other storage structure). The terms signal and value are used interchangeable unless specifically defined with the focus being on control the delay, such as the amount of delay introduced. This method provides the higher rate data signal to a data monitor and processes the higher rate data signal with the data monitor to evaluate the serializer timing. A delay controller receives the information regarding the evaluation of the serializer timing and it generates a delay control signal or value. This method then adjusts timing of the serializer control signal based on the delay control signal or value.

In one embodiment, the serializer comprises a multiplexer. It is contemplated that the serializer is in a semiconductor package and the providing the higher rate data signal to the data monitor comprises providing the higher rate data signal to a data monitor that is external to the semiconductor package. The serializer timing may affect an eye of an eye diagram formed from the higher rate data signal, or the serializer timing may affect a bit error rate of the higher rate data signal. In one configuration, the timing of the serializer is controlled by one or more delays that receive the delay control signal or value.

In one embodiment, the serializer control signal is a clock signal or a delayed version of the clock signal. This method of operation may further comprise retrieving one or more delay control values from a look up table in a memory and the one or more delay control values functions as the delay control signal or to control the amount of delay introduced in the clock signal.

Also disclosed herein is a system for controlling serializer timing when sampling input signals. In one embodiment, this system comprises a serializer configured to receive and sample two or more input data signals and generate an output data signal, such that a sampling time is based on a serializer control signal or value. Also part of the system is a delay controller configured to receive information about the output data signal that represents the accuracy of the sampling time and process the information to generate a delay control signal or value. A delay is configured to receive and modify a clock signal based on the delay control signal or value to generate the serializer control signal.

The serializer may comprise a multiplexer. In one embodiment, the two or more input signals are at a lower data rate than the output data signal. The system may further comprise a data monitor configured to evaluate the output data signal and generate the information about the output data signal that represents the accuracy of the sampling time. The data monitor may comprise an eye diagram monitor, a bit error rate monitor, or both. In one embodiment the system further includes a memory configured to store serializer control values (signals) in a look-up table such that the serializer control signals in a look-up table are indexed based on the information about the output data signal that represents the accuracy of the sampling time.

Other systems, methods, features and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 4 illustrates plots of the inputs to and the output from the multiplexer when the clock is subject to drift.

DETAILED DESCRIPTION

Figure 1:
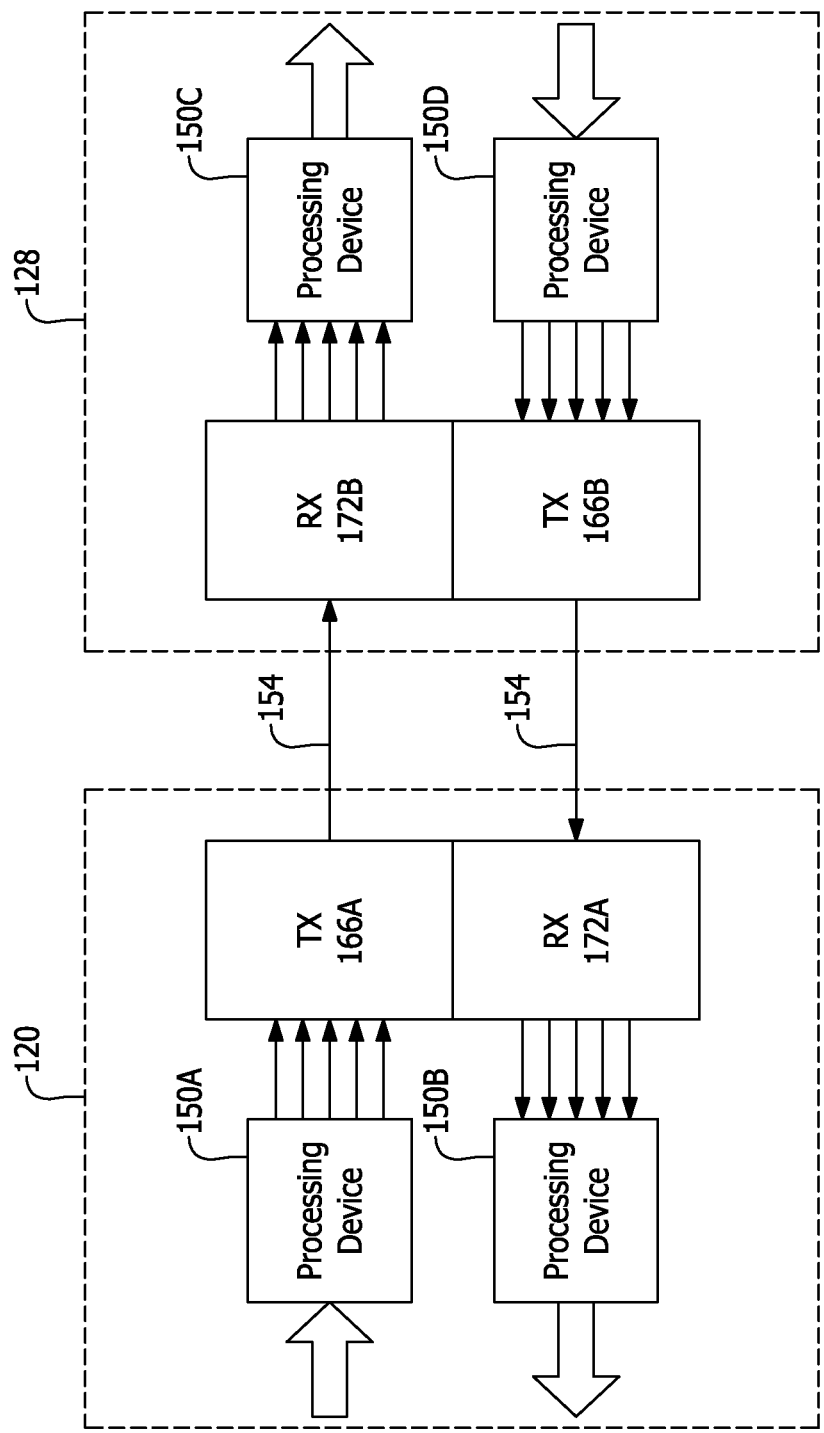
FIG. 1 illustrates a block diagram of an example embodiment of a multi-station communication system.
Figure 2:
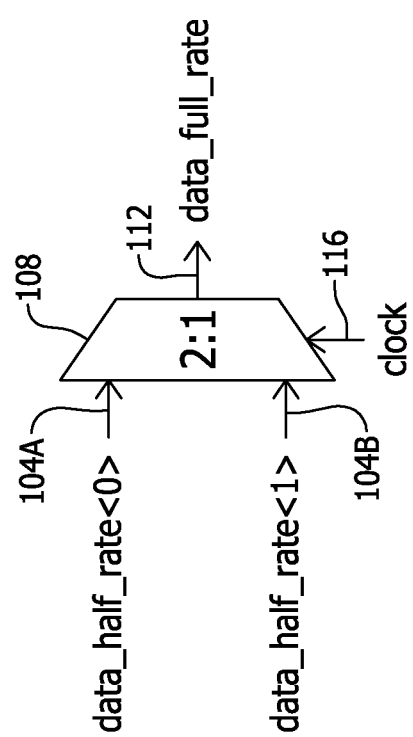
FIG. 2 illustrates a multiplexer configured in two to one serializer configuration.
Figure 3:
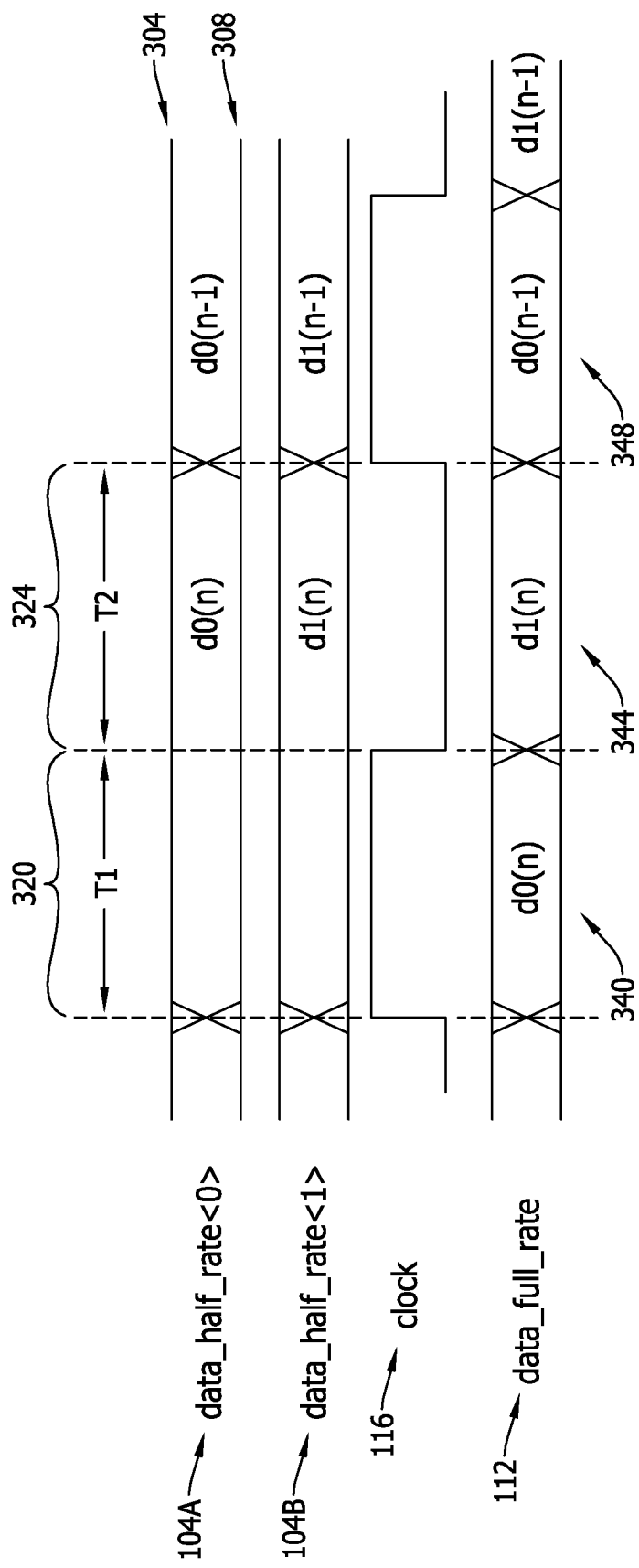
FIG. 3 illustrate plots of the inputs to the multiplexer shown in FIG. 2 and the resulting output signal.

Upon considering the system and functionality described and shown in FIGS. 2 and 3, the inventors realized that the prior art systems suffer from drawbacks when implemented. The clock signal's operation relies on logic elements, delays, and other devices found in semiconductors. The operation of these devices varies over time. For example the semiconductor elements, such as logic gates and delays in the clock path which are subject to drift due to changes in temperature, aging, device variations, and supply voltage variation. As a result, the transitions of clock can vary over time, which disrupts system operation.

FIG. 4 illustrates plots of the inputs to and the output from the multiplexer when the clock is subject to drift. As shown, the half-rate signals 104A, 104B remain the same, however the clock signal 116 had drifted to the right, such that it is slightly delayed in time. As a result, the rising edge of the clock 420 is no longer time aligned with the signal transitions 430A, 430B in the half-rate signals 104A, 104B. Consequently, the multiplexer, during a time T3 404 when the clock is low, outputs the half-rate data 104B, which is the signal D(1) value. Then, when the clock transitions to a high value at transition 420, the multiplexer then outputs signal D(0) 104A during time period T4 412. Then when the when the clock transitions to a low value at transition 424, the multiplexer then outputs signal D(1) 104B during time period T5 416.

It can be seen by analyzing the resulting full-rate data signal, it can be seen that the delayed clock signal creates a corrupt multiplexer output. In particular, during the clock period T6 460, the clock signal is low, and as a result the multiplexer output will be outputting the half-rate signal D(1) 104B as would be consistent with the sampling shown in FIG. 3. However, during the time T6 when the clock is low, the half-rate signal D(1) 104B has a transition 464, and at this transition the low data signal may transition from a high level to a low level or transition from a low level to high level. This should not occur as half-rate data signals 104A, 104B should not experience a transition during the middle of the clock period.

Figure 5A:
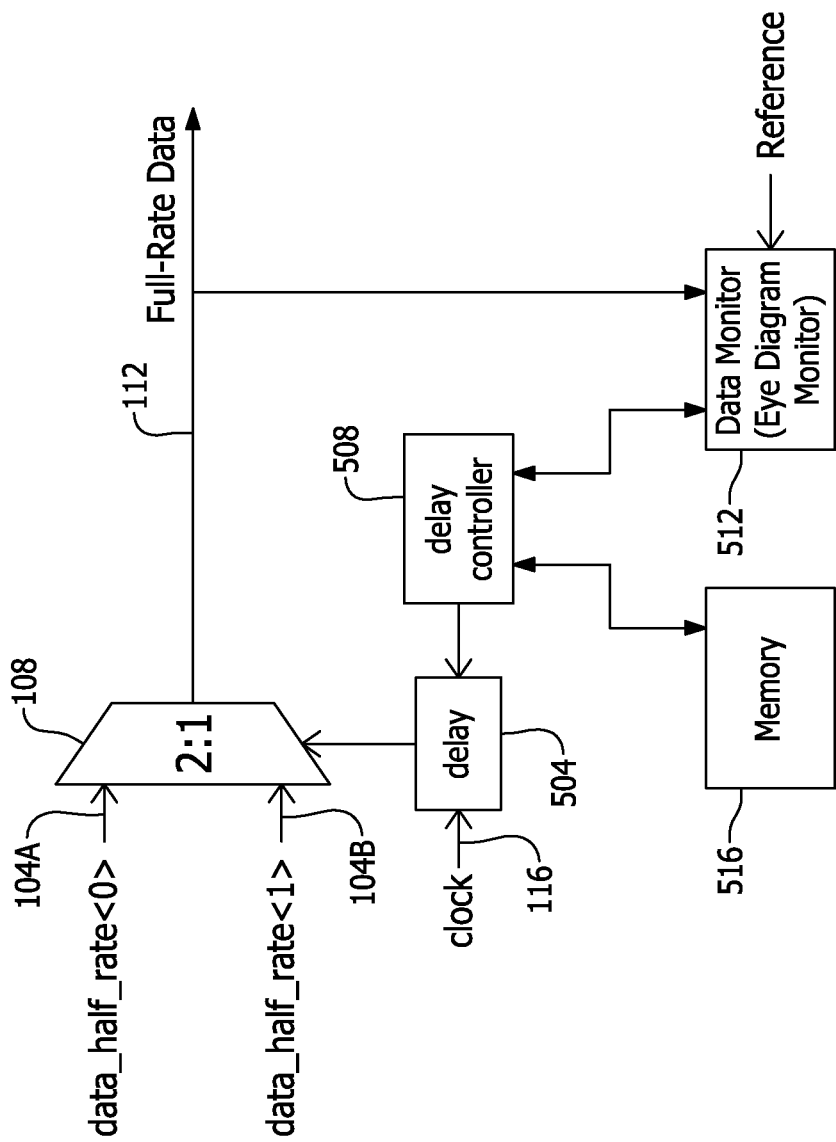
FIG. 5A illustrates a data rate conversion system with adjustable clock delay.

To overcome the drawbacks of the prior art, proposed is a method and apparatus to reduce or prevent drift in the clock signal. FIG. 5A illustrates a data rate conversion system with adjustable clock delay. As compared to FIG. 2, similar elements are referenced with identical reference numbers. In this embodiment, the clock input 116 is provided to a delay 504 configured to advance or delay the clock signal. The term delay should be understood to be any element or combination of elements which adjust the timing of the clock signal. In this embodiment, the clock signal is provided to the delay, which is in turn provided to the multiplexer 108 to control which input signal is sampled as the output. In addition, although shown as a multiplexer or serializer, other devices may be utilized which function as described herein. Although shown as two channels, a greater number of channels or inputs may be used. The innovation may also be used in connection with a de-serializer.

The delay 504 may be any type hardware, software, or both configured to adjust clock signal timing. Exemplary types of delays include but are not limited to, a phase interpolator, one or more variable capacitors, phase benders, or any other device capable of delaying a clock signal. If implemented as a phase interpolator, a digital control signal may be provided to the delay 504 to control the amount of phase adjustment, such as a 6-bit code, which provides 64 level of resolution (adjustability), or a 10-bit code which provides 1024 levels of resolution. If implemented with variable capacitor(s), the capacitance may be varied based on a control signal to change the amount of delay introduced into the clock signal. If implemented with a phase blender, one or more inverters are connected in a sting or combination to adjust the delay of the clock signal. As with the other embodiments, a control signal may control the phase blender operation or operation of any other device to achieve the desired amount of delay.

A delay controller 508 provides a delay control signal to the delay 504. The delay controller 508 generates a control signal to control the amount of clock adjustment (or delay introduced into the clock) by the delay 504. The delay controller 508 may comprise any type hardware, software, or both. In one embodiment the delay controller 508 comprises control logic arranged to process one or more inputs to generate the delay control signal or value. The control logic may include one or more counters that will increment or decrement the delay code depending on the result from the data monitor/BER/memory. In one embodiment the delay controller 508 comprises software algorithms executing on a processor, or a digital signal processor. The delay controller 508 may also be an ASIC or other purpose build circuit. It is also contemplated that the delay controller 508 may be on-chip, on-package, off-package, or off-chip. Various embodiments of the delay controller processing are described below.

The delay controller 508 also communicates with a memory 516 and a data monitor 512. The memory 516 may comprise any type of memory such as RAM, registers, flash memory, volatile or non-volatile memory, or any other type of memory. The memory may be located on the device or at a remote location. The data monitor 512 is configured to monitor and process the full-rate data on the output 112. The data monitor 512 is configured to compare the full-rate data to a reference signal which may establish a reference timing or may be a control signal that sets the amount of delay. In the embodiment of FIG. 5A, a feedback loop is provided as shown and a comparison occurs between the reference signal and the full-rate data signal. Based on this comparison the amount of delay in the clock signal may be adjusted (clock timing advanced or delayed) to have the actual amount of delay match or approach the delay set by the reference signal. In one embodiment, the memory 512 stores a look-up table with the delay control values.

It is contemplated that the data monitor 512 may be located on the same integrated circuit as the multiplexer, within the same package or located external to the package, or be separate elements, such as laptop or desktop computer. For example, it is contemplated that the entire system may be self-contained and self-adjusting. The system may also be programmed or pre-configured with a delay adjustment value or be periodically adjusted to set the desired amount of delay. It is also contemplated that a transceiver may be provided that is configured to allow access to the system from a remote location, such as over the Internet or other network connection, to allow for delay adjustment from a remote location.

In the embodiment shown in FIG. 5A, the full-rate signal is provided to a data monitor. In the data monitor 512, the data is analyzed to detect aspects of the data which may indicate a clock signal which is not properly synchronized with the data being sampled (half-rate data signals). Various types of data monitoring are discussed below. The data monitor 512 processes the full-rate data to generate information to the delay controller 518, which in turn generates the delay control signal for the delay 504.

Various types of data monitors are contemplated. In one embodiment, the data monitor comprises an eye diagram monitor. The eye diagram monitor may be located on chip or external to the device. In one configuration, the eye diagram monitor is enabled in software executing on a processor.

It is also contemplated that this method and system may be implemented in connection with a de-serializer (de-multiplexer) and not just a serializer (multiplexer). In the case of a de-serializer (de-multiplexer) environment, the timing of the de-serializer (de-multiplexer) is important to the accurate generation of the two or more lower rate data signals from a high-rate data signal.

Figure 5B:
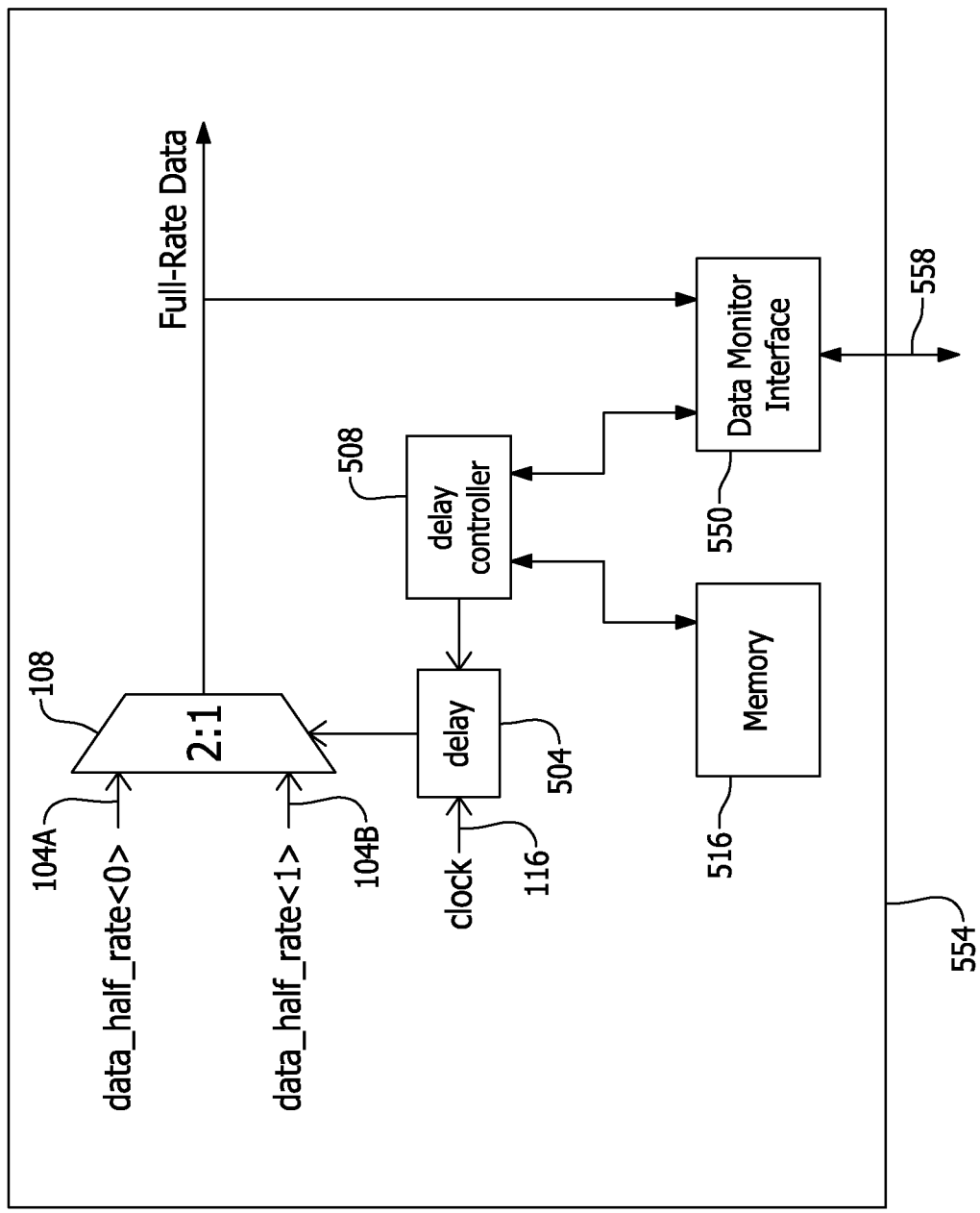
FIG. 5B illustrates a data rate conversion system with adjustable clock delay configured to off-chip communication.

FIG. 5B illustrates a data rate conversion system with adjustable clock delay configured to off-chip communication. As compared to FIG. 5A, identical elements are labeled with identical reference numbers. In the embodiment of FIG. 5B, a data monitor interface 550 is provided in place of the data monitor shown in FIG. 5A. The data monitor interface 550 includes a I/O path 558 which communicates with a data monitor that is external to the chip 554.

Figure 6:
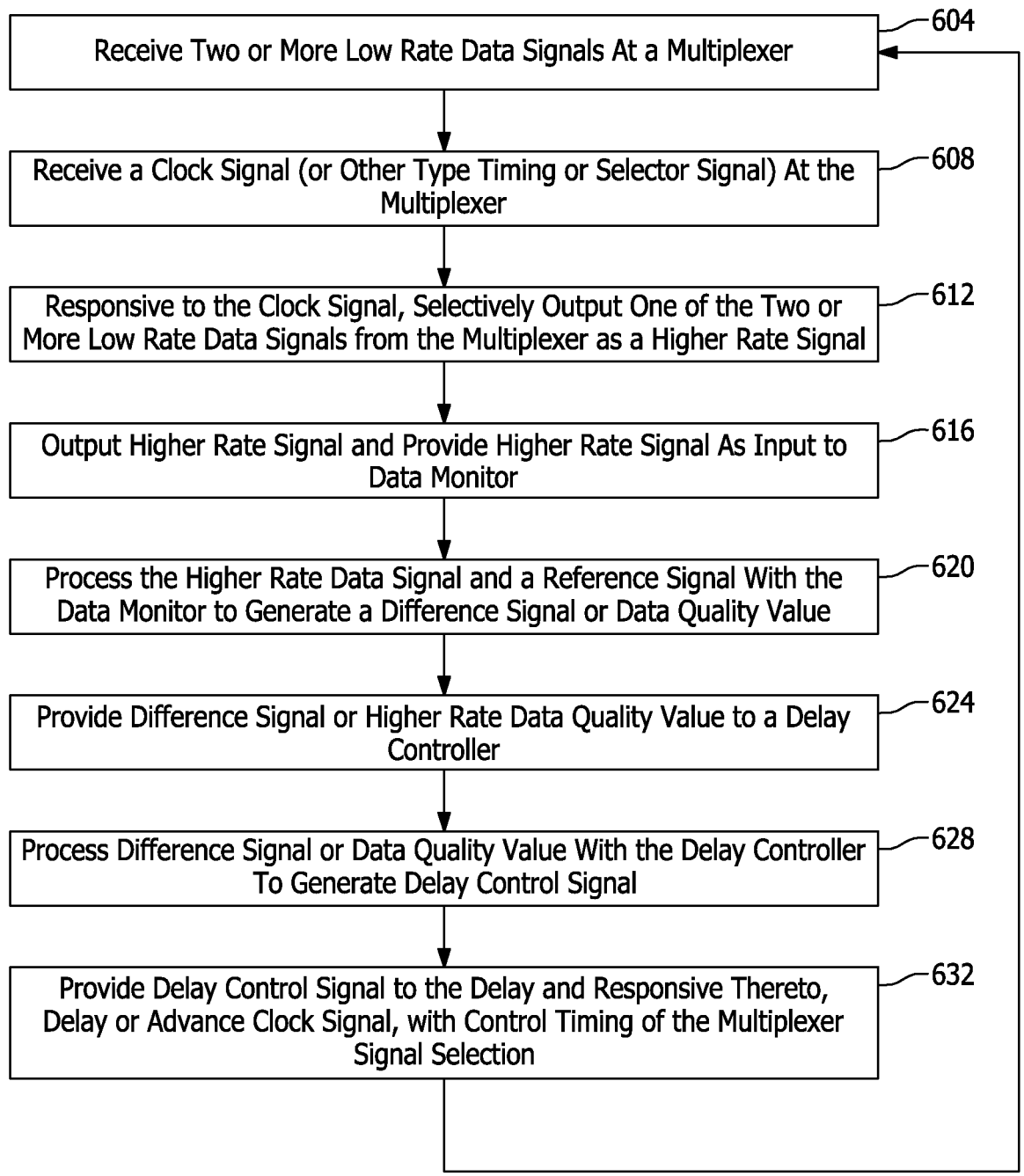
FIG. 6 illustrates an operational flow diagram of an example method of operation of one example embodiment.

FIG. 6 illustrates an operational flow diagram of an example method of operation of one example embodiment. This is but one possible method of operation and as such, other methods of operation are contemplated. At a step 604, the multiplexer (serializer) receives two or more low-rate data signals. The low-rate data rate signals may be received from a transmitter prior to being serially transmitted over a communication channel at a higher data rate. At a step 608 the multiplexer receives a clock signal, or any other type of timing or selector signal. This is the multiplexer (serializer) control signal.

At a step 612, responsive to the clock signal, selectively outputting one of two or more low-rate data signal from the multiplexer as a high-rate data signal. The higher rate data signal is at a higher data rate than the low-rate data signal and as such, the multiplexer alternates between sampling the low-rate data signal to form the higher rate data signal. The precise timing of the sampling is important to avoid corrupting or distorting the high-rate data signal, which results in an increased bit error rate (BER) or a narrowing of the eye in an eye diagram formed by the higher rate data signal. At a step 616, the multiplexer outputs the higher rate data signal as an output, such as for transmission over a communication channel, and also provides the higher rate data signal to a data monitor. The data monitor analyzes the higher rate data signal as discussed below.

At a step 620, the data monitor processes the higher rate data signal and optionally a reference signal, to generate a difference signal (the difference in timing between the higher rate data signal and the reference signal), or a data quality signal indicative of the timing of the data signal. The data monitor processing may analyze an eye diagram and the quality of the eye, or calculate a bit error rate, or calculate the vertical amplitude of the eye-opening or the horizontal width/time of the open eye. Other methods of monitoring the data to evaluate the serializer timing are contemplated and are covered by the scope of the claims. In addition, other methods and systems may be used to analyze the quality of the higher rate signal and in particular the timing accuracy of the signal that controls when each input is provided as the output of the multiplexer (serializer). Then, at a step 624 the difference signal, indicating timing error, or a data quality value (information or indicator) is provided to a delay controller. This connection is shown in FIG. 5A and FIG. 5B.

At a step 628 the delay controller processes the difference signal, indicating timing error, or a data quality value to generate a delay control signal. Control logic or software-based processing may occur to generate the delay control signal. The delay control signal may advance or delay the timing of the clock signal provided to the multiplexer. It is also contemplated that the delay controller may access the memory to retrieve the delay control signal (value). For example, based on processing by the delay controller or based on the data quality values, a look-up table stored in memory may be accessed to retrieve a pre-stored value. The pre-stored values may be generated at the time of manufacture or once the system is connected at the point of use. At a step 632, the delay control signal is provided to the delay (or other timing control element) and responsive thereto the delay advances or delays the clock signal, which in turn controls the sampling timing of the multiplexer (serializer). After step 632 the operation returns to step 604.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A serializer clock delay optimization system comprising:
    a multiplexer, configured to receive two or more low-rate data signals and a multiplexer control signal, and generate a full-rate data signal by combining the two or more low-rate data signals;
    a data monitor configured to monitor and evaluate the full-rate data signal to generate a quality value representing the quality of the full-rate data signal;
    a delay controller configured to process the quality value and responsive thereto generate a delay control signal; and
    a delay configured to receive a clock signal and the delay control signal and, responsive to the delay control signal, modify the timing of the clock signal to create the multiplexer control signal.

2. The system of claim 1 wherein the data monitor comprises an eye diagram monitor and the quality signal represents one or more characteristics of the eye formed by the full-rate data signal.

3. The system of claim 1 wherein the data monitor comprises a bit error rate generator and the quality value comprises a bit error rate of the full-rate data signal.

4. The system of claim 1 wherein the two or more low-rate data signals comprises two signals which are at a data rate which is one-half of the full-rate data signal.

5. The system of claim 1 wherein the delay controller comprises control logic configured to process the quality value.

6. The system of claim 1 further comprising memory accessible by the delay controller, the memory configured to store delay control signals as values in a look-up table.

7. A method for optimizing sampling timing of a serializer comprising:
    receiving two or more lower rate data signals at a serializer and converting the two or more lower rate data signals to create a higher rate data signal, such that the timing of the serializer's converting is controlled by a serializer control signal;
    providing the higher rate data signal to a data monitor and processing the higher rate data signal with the data monitor to evaluate the serializer timing;
    providing information regarding the evaluation of the serializer timing to a delay controller and generating, with the delay controller, a delay control value or signal; and
    adjusting timing of the serializer control signal based on the delay control value or signal.

8. The method of claim 7 wherein the serializer comprises a multiplexer.

9. The method of claim 7 wherein the serializer is in a semiconductor package and providing the higher rate data signal to the data monitor comprises providing the higher rate data signal to a data monitor that is external to the semiconductor package.

10. The method of claim 7 wherein the serializer timing effects an eye of an eye diagram formed from the higher rate data signal.

11. The method of claim 7 wherein the serializer timing effects a bit error rate of the higher rate data signal.

12. The method of claim 7 wherein adjusting the timing of the serializer control signal is performed by one or more delays that receive the delay control value or signal.

13. The method of claim 7 wherein the serializer control signal is a clock signal or a delayed version of the clock signal.

14. The method of claim 7 further comprising retrieving one or more delay control values from a look up table in a memory and the one or more delay control values function as the delay control signal.

15. A system for controlling serializer timing when sampling input signals comprising:
    a serializer configured to receive and sample two or more input data signals and generate an output data signal, such that a sampling time is based on a serializer control signal;
    a delay controller configured to receive information about the output data signal that represents the accuracy of the sampling time and process the information to generate a delay control signal;
    a delay configured to receive and modify a clock signal based on the delay control signal to generate the serializer control signal or value.

16. The system of claim 15 wherein the serializer comprises a multiplexer.

17. The system of claim 15 wherein the two or more input signals are at a lower data rate than the output data signal.

18. The system of claim 15 further comprising a data monitor configured to evaluate the output data signal and generate the information about the output data signal that represents the accuracy of the sampling time.

19. The system of claim 15 wherein the data monitor comprises an eye diagram monitor, a bit error rate monitor, or both.

20. The system of claim 15 further comprising a memory configured to store the delay control signals as values in a look-up table such that the values in a look-up table are indexed based on the information about the output data signal that represents the accuracy of the sampling time.

\* \* \* \* \*